United States Patent [19]
Lada et al.

[11] Patent Number: 4,728,252
[45] Date of Patent: Mar. 1, 1988

[54] WAFER TRANSPORT MECHANISM

[75] Inventors: Christopher O. Lada, Palo Alto; Raymond L. Degner, Los Altos; Robert T. LoBianco, Sunnyvale, all of Calif.

[73] Assignee: Lam Research Corporation, Fremont, Calif.

[21] Appl. No.: 899,563

[22] Filed: Aug. 22, 1986

[51] Int. Cl.[4] .............................................. B65H 5/00
[52] U.S. Cl. ................................. 414/744 R; 74/479; 414/749; 901/21; 901/23
[58] Field of Search ........... 414/222, 225, 226, 744 R, 414/744 A–744 C, 749, 751–753, 217; 901/15, 17, 21, 23; 74/52, 479, 665 A, 665 E

[56] References Cited

U.S. PATENT DOCUMENTS

| Re. 25,889 | 10/1965 | Willsea | 214/1 |
|---|---|---|---|
| 3,010,587 | 11/1961 | Hollinger | 414/744 A |
| 3,363,474 | 1/1968 | Ritter et al. | 414/749 X |
| 3,656,454 | 4/1972 | Schrader | 118/49 |
| 3,874,525 | 4/1975 | Hassan et al. | 214/17 |
| 4,392,776 | 7/1983 | Shum | 414/744 R |
| 4,398,863 | 8/1983 | Shum | 901/23 X |
| 4,433,951 | 2/1984 | Koch et al. | 414/744 R |
| 4,483,654 | 11/1984 | Koch et al. | 414/744 R |
| 4,552,505 | 11/1985 | Gorman | 901/15 X |
| 4,584,045 | 4/1986 | Richards | 414/222 X |
| 4,619,575 | 10/1986 | Summa et al. | 414/753 X |
| 4,687,542 | 8/1987 | Davis et al. | 414/744 R X |
| 4,693,666 | 9/1987 | Garin | 414/744 R |
| 4,695,215 | 9/1987 | Jacoby et al. | 414/752 X |

FOREIGN PATENT DOCUMENTS

| 3326962 | 2/1985 | Fed. Rep. of Germany | 901/21 |
|---|---|---|---|
| 3511531 | 10/1986 | Fed. Rep. of Germany | 414/744 R |
| 55-116432 | 9/1980 | Japan. | |
| WO86/03158 | 6/1986 | World Int. Prop. O. | 901/50 |
| 1395058 | 5/1975 | United Kingdom. | |
| 2022047A | 12/1979 | United Kingdom. | |
| 1570066 | 6/1980 | United Kingdom. | |
| 2121747A | 1/1984 | United Kingdom. | |
| 595224 | 2/1978 | U.S.S.R. | 414/749 |

Primary Examiner—Robert J. Spar
Assistant Examiner—P. McCoy Smith
Attorney, Agent, or Firm—Townsend & Townsend

[57] ABSTRACT

A workpiece transfer apparatus includes a drive assembly and a transfer arm assembly. The transfer arm assembly is articulated, including a linking arm enclosure pivotally attached to a transfer arm. The linking arm enclosure is mounted on a rotatable sleeve, which in turn is mounted in a bearing assembly which is mountable in a housing. A shaft runs axially through the sleeve and terminates with a pulley within the linking arm enclosure. The transfer arm is coupled to the shaft so that rotation of the sleeve relative to the shaft causes articulation of the transfer arm assembly. A first motor causes rotation of the sleeve and the shaft simultaneously, which effects rotation of the transfer arm relative to the housing. A second motor rotates the sleeve relative to the shaft, causing translation of the transfer arm relative to the housing.

21 Claims, 5 Drawing Figures

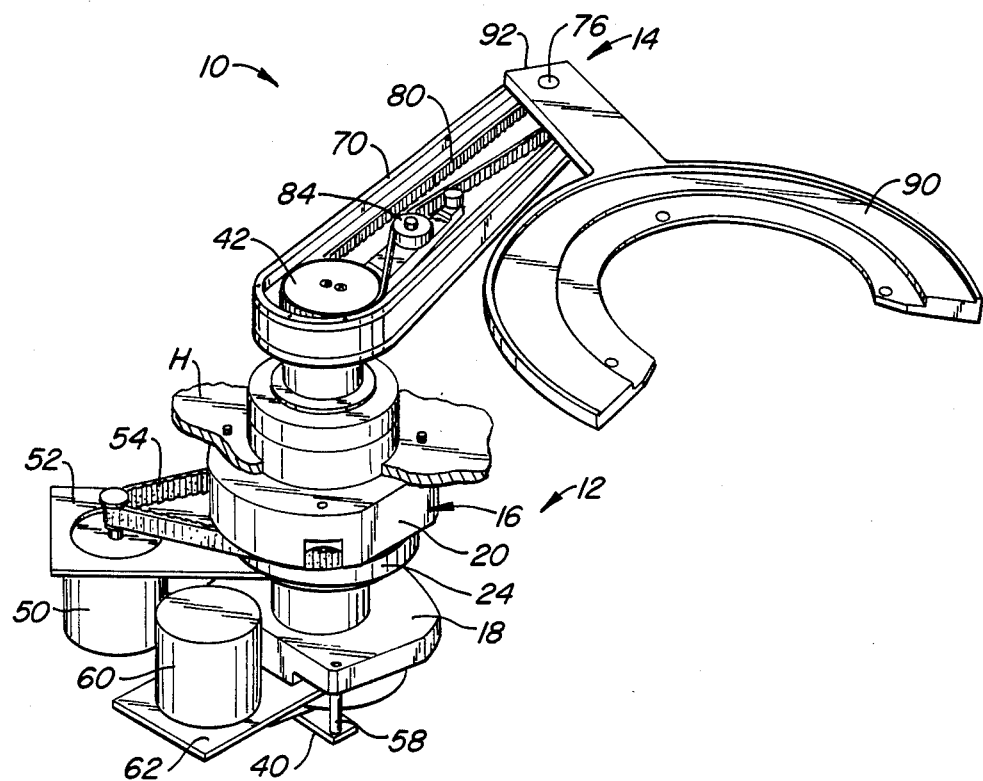
FIG._1.

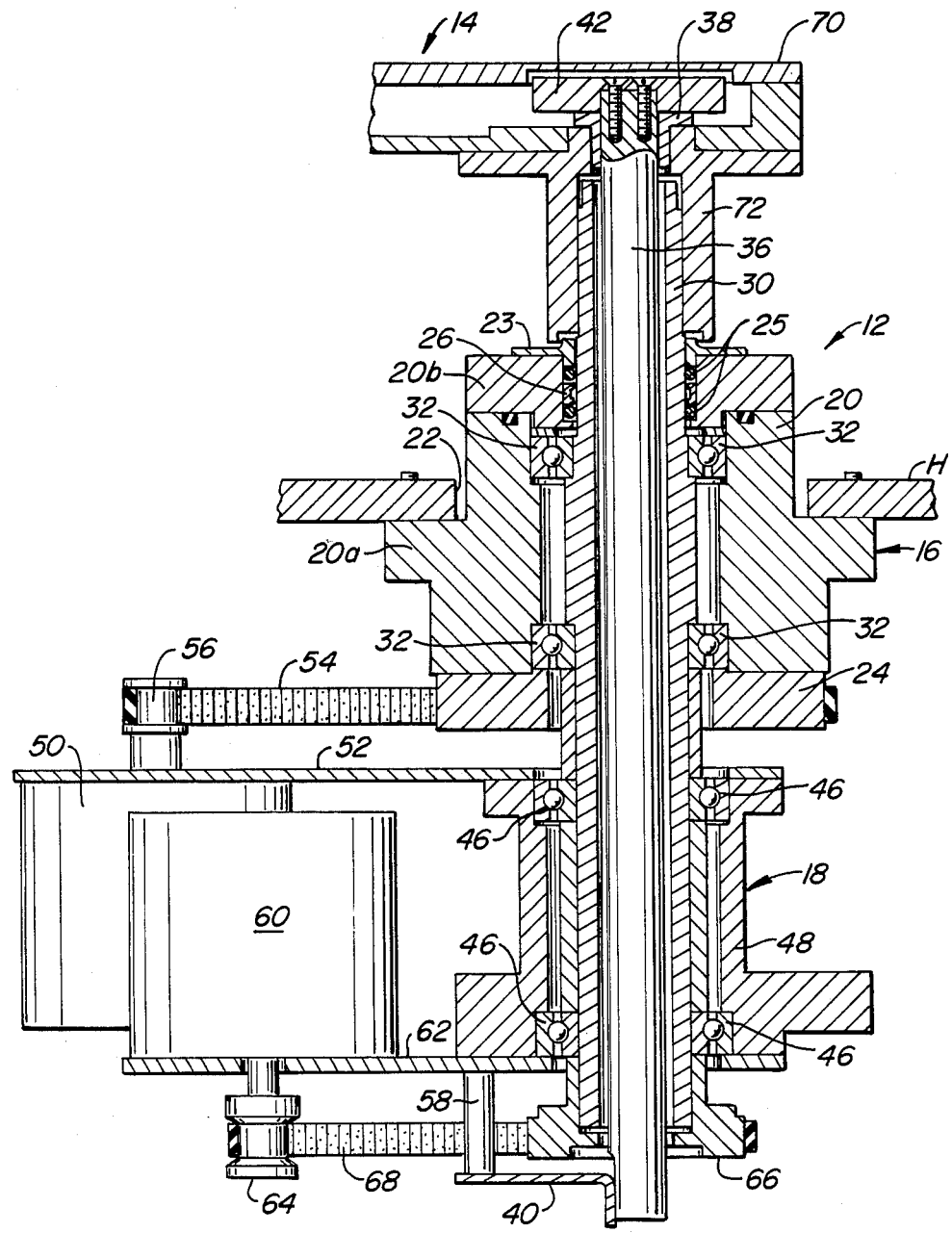
FIG._2.

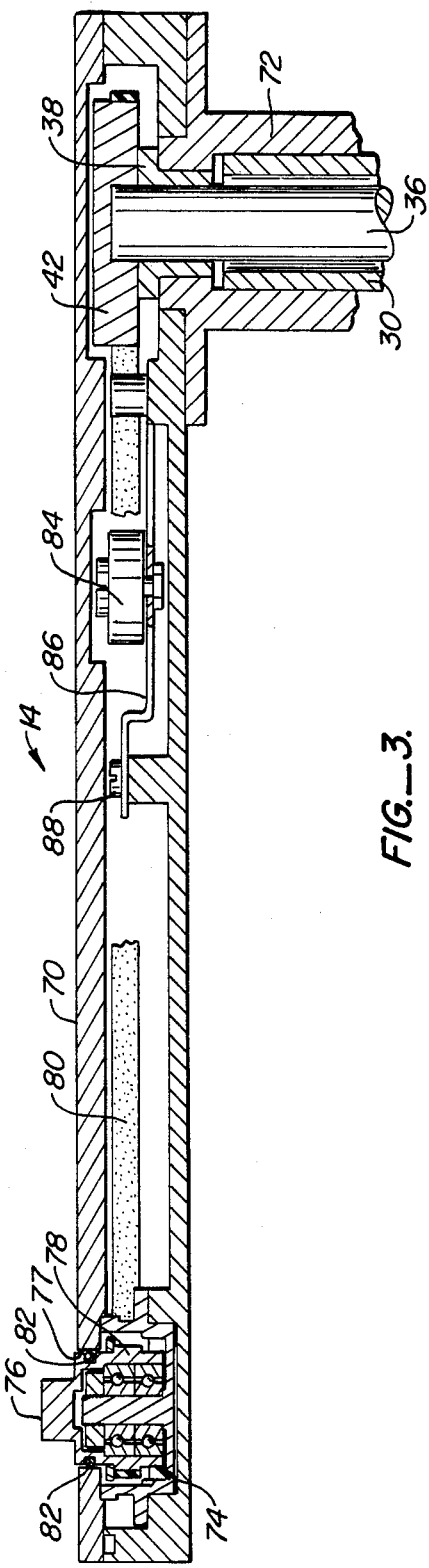
FIG._3.

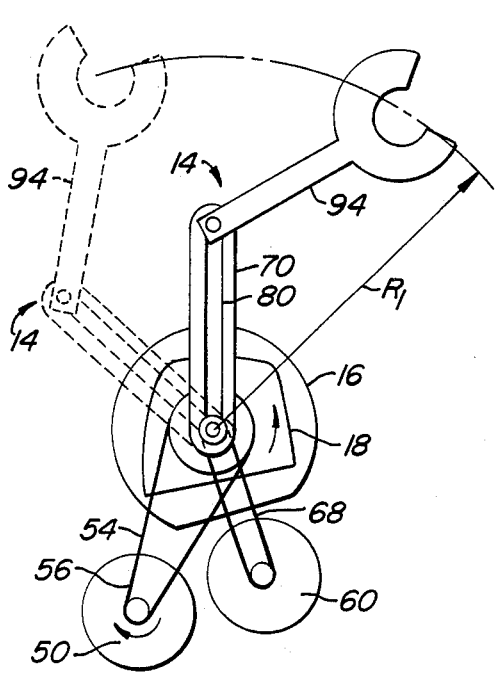
FIG._4.
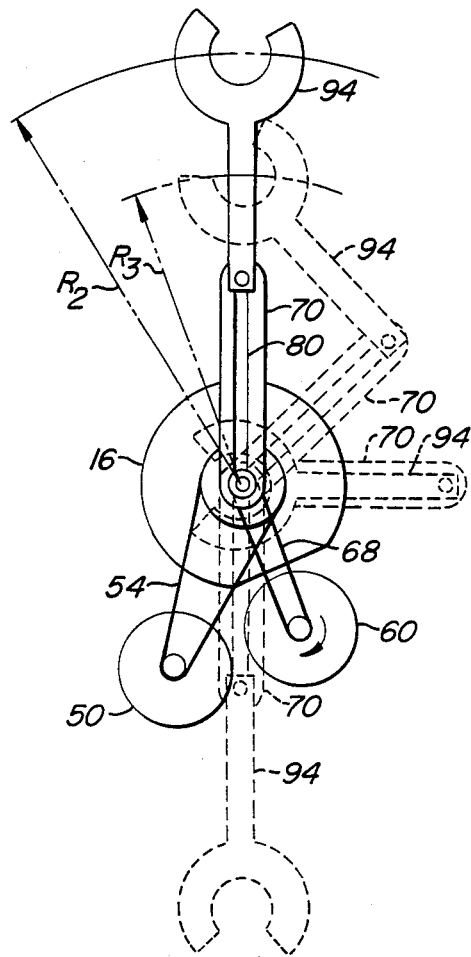
FIG._5.

WAFER TRANSPORT MECHANISM

BACKGROUND OF THE INVENTION

1. Field of the Invention

The present invention relates generally to material handling equipment, and more particularly to an apparatus for transporting semiconductor wafers through a loadlock into vacuum processing equipment.

Loadlocks, also referred to as airlocks, are routinely employed in a variety of circumstances where material must be moved from an area at a first pressure to a different area at a second pressure. The loadlock is a sealable chamber where the internal pressure can be adjusted to match the outside pressure found at one or more ports. Of particular interest to the present invention are loadlocks which allow transport of semiconductor wafers from a first pressure, typically ambient, to processing equipment operating at very low pressures, such as plasma etchers and the like.

Operation of the loadlock requires a mechanism for retrieving the material from the outside, transporting the material to the interior of the airlock, supporting the material while the airlock is evacuated, and delivering the material to the desired processing vessel when the pressure has been equalized. A variety of systems, normally employing manipulable arms, have been developed, and some of these systems are described in detail in the Prior Art cited hereinbelow. The prior art systems, however, suffer from a number of disadvantages which limit their usefulness and require relatively frequent maintenance. A major disadvantage of the systems is the presence of exposed joints, bearings, hinges, and the like, which require lubrication. The lubricating fluid applied to such mechanical connections quickly vaporizes in the low pressure environment, requiring frequent reapplication and in the worst case failure of the system. More importantly, such exposed joints generate particulates each time the joint is operated, and the particulates will frequently deposit on the wafers being transported. Particulates on the wafer surface can degrade the product which is eventually produced.

A second disadvantage of the prior art systems has been the large size of the transfer assemblies. While it is desirable to minimize the volume of the loadlock in order to reduce the time and power required to draw a vacuum therein, the size of the transfer assembly frequently requires enlargement of the loadlock.

Additionally, the prior art transfer mechanisms frequently do not allow for minor adjustments to the pickup and discharge locations, such as those which are frequently required because of misalignment of the loadlock with the processing equipment. Such systems are often also limited mechanically to transport along one or two preselected patterns, and cannot be later adjusted to provide for different delivery geometries.

For these reasons, it would be desirable to provide a workpiece transfer assembly suitable for operation in very low pressure environments and having few, if any, exposed lubricated joints. It would be further desirable if the mechanism is adapted so that the majority of moving parts lie outside of an associated loadlock, and that the mechanism be adjustable and provide for a variety of different transport patterns and easy correction of minor misalignments.

2. Description of the Prior Art

Of particular interest to the present invention are U.S. Pat. Nos. 4,433,951 and 4,483,654, which relate to a wafer transport mechanism employing a rotatable, articulated arm. The mechanism includes numerous lubricated joints which are exposed to the vacuum inside a loadlock. A number of U.S. and foreign patents disclose alternative mechanisms for transporting wafers to and from vacuum processing equipment, see, e.g. U.S. Pat. Nos. Re. 25,889; 3,656,454, and 3,874,525; British Pat. Nos. 1,395,058; 1,570,066; 2,022,047A; and 2,121,747A, and Japanese Pat. 55-116432.

SUMMARY OF THE INVENTION

A workpiece transport apparatus according to the present invention provides for pickup and discharge of a workpiece between any two locations within an arbitrary radius of operation. The transport apparatus is particularly suited for mounting within a low pressure environment, such as a loadlock, since it provides for a minimum number of exposed joints and bearing surfaces. Moreover, the transport apparatus is largely self-contained so that only a portion of the apparatus need be mounted inside a low pressure housing, with the remainder of the apparatus being located outside of the housing.

The workpiece transport apparatus includes a cylindrical sleeve mounted coaxially about a shaft, with both the sleeve and the shaft being independently rotatable relative to the housing in which they are mounted. A linking arm is attached at its proximate end to one end of the sleeve, and a workpiece transfer arm is rotatably mounted at the distal end of the linking arm. A linkage assembly couples the workpiece transfer arm to the shaft so that rotation of the sleeve relative to the shaft causes a change in the radial position of the distal end of workpiece transfer arm. Simultaneous rotation of the sleeve and the shaft, in contrast, adjusts the angular position of the workpiece transfer arm.

In a preferred embodiment, the sleeve is mounted in a first bearing assembly which in turn is secured to a housing so that the sleeve extends through a wall of the housing and is rotatable. The first bearing assembly provides a rotary seal which assures the integrity of the vacuum housing at the penetration of the bearing. A second bearing assembly is mounted on the sleeve, preferably at a location which lies outside of the housing, and provides a mounting block which is rotatable relative to the sleeve. By fixing the shaft to the mounting block, and coupling the sleeve to a drive motor secured to the block, the sleeve may be rotated relative to the shaft. Similarly, by coupling the housing to a second drive motor mounted on the block, both the shaft and the sleeve may be rotated simultaneously. The linking arm is preferably a hollow enclosure secured to the top of the sleeve, and the work transfer arm is mounted on a bearing assembly at the distal end of the linking arm enclosure. A means is provided internally to the linking arm enclosure for coupling the shaft to the sealed bearing assembly, and in this way only two joints are exposed to the vacuum.

BRIEF DESCRIPTION OF THE DRAWINGS

FIG. 1 is a perspective view of the workpiece transfer apparatus of the present invention.

FIG. 2 is a side elevational view of the drive assembly of the workpiece transfer apparatus, shown in cross-section.

FIG. 3 is a side elevational view of the transfer arm assembly of the workpiece transfer apparatus, shown in cross-section.

FIG. 4 is a schematic view illustrating rotation of the transfer arm assembly at a constant radius.

FIG. 5 is a schematic view illustrating translation of the workpiece transfer assembly along a straight line.

DESCRIPTION OF THE PREFERRED EMBODIMENT

Referring to FIGS. 1-5, a workpiece transport apparatus 10 constructed in accordance with the principles of the present invention will be described in detail. The apparatus 10 includes a drive assembly 12 and a transfer arm assembly 14. The drive assembly 12 is mounted in a housing H, which is typically a loadlock such as that described in U.S. Pat. No. 4,483,654, the disclosure of which is incorporated herein by reference. The utility of the workpiece transfer apparatus 10 of the present invention, however, is not limited to use in loadlocks, although its design offers particular advantages when employed in low pressure environments.

Referring in particular to FIGS. 1 and 2, the drive assembly 12 includes an upper bearing assembly 16 and a lower bearing assembly 18. All references to upper and lower directions will be made relative to the orientation of the apparatus 10 in the drawings. The upper bearing assembly 16 includes an outer shell 20 (including a cylindrical body 20a and cover 20b) which penetrates an opening 22 through a wall of the housing H. The shell 20 is fixed to the housing H and will not move relative thereto. A seal cap 23 is provided to retain O-rings 25 and spacer 26, as described hereinafter. A pulley 24 is formed integrally at the lower end of the bearing shell 20 for the reasons set forth more fully hereinbelow.

A sleeve 30 is rotatably received within the upper bearing assembly 16 on a plurality of ball bearings 32. Thus, the sleeve 30 is free to rotate relative to the outer shell 20 of the upper bearing assembly 16 as well as the housing H. A dynamic seal between the sleeve 30 and the shell 20 is provided by O-rings 25 and spacer 26. The O-rings 25 protect the vacuum inside the housing H from leakage through the sole penetration 22 required by the apparatus 10.

A shaft 36 is mounted coaxially within the center of sleeve 30 and held in place at its upper end by a bearing 38 and at its lower end by bracket 40. A pulley 42 is mounted on the upper end of the shaft 36 and is located within the transfer arm assembly 14, as will be described in more detail hereinafter.

The lower bearing assembly 18 is mounted on sleeve 30 by a plurality of ball bearings 46 so that outer shell 48 is free to rotate relative to the sleeve. A first drive motor 50, typically an electric stepper motor or DC servo motor, is mounted on a bracket 52 which is secured to the upper end of shell 48 of the lower bearing assembly 18. A belt 54, e.g., a timing belt, extends between spindle 56 on motor 50 and pulley 24 on the upper bearing assembly 16. Thus, actuation of the motor 50 will cause rotation of the outershell 48 of the lower bearing assembly 18 relative to the upper bearing assembly 16 as well as the housing H. As the shaft 36 is directly connected to the lower bearing assembly 18 by bracket 40 and post 58, the shaft will be caused to rotate synchronously with the lower bearing assembly 18 as caused by drive motor 50.

A second drive motor 60, which will usually be an electric stepper motor or DC servo motor, is also secured to the lower bearing assembly 18, conveniently by a bracket 62. Spindle 64 of motor 60 is connected to a pulley 66, formed on the lower end of sleeve 30, by a belt 68, typically a timing belt. Thus, actuation of second motor 60 causes the sleeve 30 to rotate relative to the lower assembly 18. So long as lower bearing assembly 18 remains stationary, of course, rotation of sleeve 30 relative to the upper bearing assembly 16 and housing H will also be effected by drive motor 60.

It will be appreciated that a wide variety of mechanisms for coupling the drive motors 50 and 60 to the pulleys 24 and 66 may be employed, e.g., chain drives, cable drives, direct gear drives, gear reducers, and the like. In particular, worm drive gears are advantageous because of their positive action and resistance to wear and stretching which are frequently found with other types of drives.

Referring now also to FIG. 3, the transfer arm assembly 14 includes a linking arm enclosure 70 which is attached to the upper end of sleeve 30 by a mounting collar 72. A bearing assembly 74 is mounted in the distal end of the enclosure 70 and includes a output shaft 76. Shaft 76 extends through a port 77 in the linking arm enclosure 70 and is connected to pulley 78, and a belt 80, e.g., a timing belt, connects pulley 78 to pulley 42 on shaft 36. Port 77 is the sole penetration of the linking arm enclosure 70, and O-ring 82 is provided around shaft 76 to prevent leakage through the penetration. Instead of a timing belt, as illustrated, it may sometimes be preferable to couple the pulley 42 and pulley 48 using a high strength cable which is resistant to stretching.

An idler roller 84 is mounted on a spring loaded carrier bracket 86 which in turn is mounted on pin 88 in the interior of the housing 70. The idler roller 84 presses against the timing belt 80 in order to take up slack according to conventional principles.

As an alternative to the single idler roller 84 as just described, the present invention may employ a pair of opposed pinch rollers (not illustrated) to take up slack in the timing belt. The opposed rollers have the advantage that the slack is taken up evenly on both sides so that the timing belt is not thrown out of synchronization.

Wafer transport arm 90 (FIG. 1) is mounted with its proximal end 92 secured to pin 76, so that said arm will rotate with the pin. The distal end of transport art 90 is shaped in order to support single silicon wafers in a well known manner.

The construction of the workpiece transport apparatus 10 is particularly well suited for operation in low pressure environments, requiring only two dynamic seals. The first seal is provided by O-rings 25 and spacer 26 in the upper bearing assembly 16. This seal allows rotation of the sleeve 30 while maintaining isolation of the interior of the housing H. The only other dynamic seal is provided by O-ring 82 on the rotating pin 76. With these seals, the interior of the linking arm enclosure 70 will be at ambient pressure and isolated from the interior of the loadlock, avoiding the lubrication and particulate generation problems discussed above.

Referring now to FIGS. 4 and 5, operation of the wafer transport apparatus 10 will be described in detail. In FIG. 4, rotation of the wafer transport arm 94 at a constant radius $R_1$ is illustrated. The transport arm assembly 14 is initially in the position shown in full line. Rotation spindle 56 on first drive motor 50 in the clockwise direction (as illustrated) causes lower bearing assembly 18 to rotate in the opposite direction, ultimately causing linking arm enclosure 70 to rotate in a counterclockwise direction. The relative angle between enclosure 70 and transport arm 94, however, remains constant since the shaft 36 is rotated by an identical amount as the assembly 18 and the sleeve 30.

FIG. 5 illustrates the situation in which the distal end of the wafer transport arm 94 is moved radially inward and outward along a straight line. Radial translation of the transport arm 94 is effected by rotation of the second drive motor 60 which causes the sleeve 30 to rotate relative to shaft 36. Rotation of sleeve 30, in turn, causes linking arm enclosure 70 to rotate, which further causes pulley 78 to rotate relative to pulley 42. Since pulley 42 is fixed, however, pulley 78 will be caused to rotate at a fixed angular velocity, depending on the ratio of the diameters of pulley 42 and pulley 78. As illustrated in FIG. 3, pulley 42 has a diameter which is exactly twice that of pulley 78, causing transfer arm 94 to articulate at an angular velocity twice that of linking arm enclosure 70.

Rotation of spindle 64 on drive motor 60 in the clockwise direction thus causes linking arm enclosure 70 to also rotate in the clockwise direction. Transfer arm 94, in contrast, is caused to rotate in the counterclockwise direction at an angular velocity twice that of the enclosure 70. Thus, since the arm 70 and 94 have the same length, the distal end of transfer end 94 will translate along a substantially straight line as the linking arm enclosure 70 is rotated.

With the foregoing in mind, it can be seen that the distal end of the wafer arm 94 can be positioned precisely at any position within the maximum extension of the workpiece transport apparatus 10. The radial position is adjusted by motor 60, while the angular position is adjusted by motor 50. Conveniently, such positioning can be accomplished by digital control systems as are well known in the art. The use of digital control systems allows virtually any transfer path to be traced by the concurrent operation of both motors 50 and 60.

Although the foregoing invention has been described in some detail by way of illustration and example for purposes of clarity of understanding, it will be obvious that certain changes and modifications may be practiced within the scope of the appended claims.

What is claimed is:

1. An apparatus for transporting a workpiece relative to a housing, said apparatus comprising:
   a sleeve mounted to rotate relative to the housing;
   a shaft mounted coaxially within the sleeve;
   a bearing assembly mounted to rotate relative to the sleeve but fixedly coupled to the shaft;
   a linking arm fixedly attached at one end to the sleeve;
   a workpiece transport arm rotatably secured to the other end of the linking arm;
   means mounted on the bearing assembly for rotating the sleeve relative to the shaft and for rotating the sleeve and shaft relative to the housing; and
   means for coupling the workpiece transport arm to the shaft so that rotation of the sleeve relative to the shaft causes the workpiece transport arm to rotate relative to the linking arm.

2. An apparatus as in claim 1, wherein the workpiece transport arm is adapted to support a single silicon wafer.

3. An apparatus as in claim 1, wherein the means for rotating the sleeve and shaft includes:
   a first motor means mounted on the bearing assembly and operatively coupled to the housing; and
   a second motor means mounted on the bearing assembly and operatively coupled to the sleeve;
   whereby the sleeve and shaft may be rotated simultaneously by actuating the first motor means and the sleeve may be rotated independently of the shaft by actuating the second motor means.

4. An apparatus as in claim 3, wherein the first motor means includes a stepper or DC servo motor coupled to the housing by a belt.

5. An apparatus as in claim 3, wherein the second motor means includes a stepper or DC servo motor coupled to the sleeve by a belt.

6. An apparatus as in claim 1, wherein the means for coupling the workpiece transport arm includes a first pulley fixedly secured to one end of the shaft, a second pulley rotatably mounted at the other end of the linking arm, and means for rotatably coupling the first pulley to the second pulley so that rotation of the linking arm about the shaft causes the second pulley to rotate.

7. An apparatus as in claim 6, wherein the workpiece transport arm is mounted on the second pulley.

8. An apparatus for transporting a workpiece through a vacuum housing, said apparatus comprising:
   a sleeve having a hollow interior;
   a first seal mounted on the housing for rotatably receiving the sleeve, whereby the sleeve extends between the interior and exterior of the housing;
   a linking arm enclosure assembly having a hollow interior, said linking arm enclosure assembly being secured at one end to the interior end of the sleeve so that the hollow interior of the sleeve is open to the hollow interior of the linking arm enclosure assembly;
   a workpiece transport arm;
   a secondary seal mounted in the other end of the linking arm enclosure assembly for receiving the workpiece transport arm;
   a shaft mounted coaxially within the hollow interior of the sleeve terminating at one end within the hollow interior of the linking arm enclosure assembly;
   a bearing assembly rotatably mounted on the sleeve and fixedly coupled to the shaft;
   means mounted on the bearing assembly for rotating the sleeve relative to the shaft;
   means mounted on the bearing assembly for rotating the sleeve and shaft relative to the housing; and
   means for coupling the workpiece transport arm to the shaft so that rotation of the sleeve relative to the shaft causes the workpiece transport arm to rotate relative to the linking arm.

9. An apparatus as in claim 8, further comprising a bearing assembly secured to the sleeve outside of the vacuum housing, said bearing assembly including an outershell capable of rotating relative to the sleeve.

10. An apparatus as in claim 9, wherein the shaft is fixed to the outershell and the means for rotating the sleeve relative to the shaft includes a first drive motor secured to the outershell and means for operatively coupling the motor to the sleeve.

11. An apparatus as in claim 10, wherein the means for coupling the first drive motor to the sleeve includes a belt and pulley assembly.

12. An apparatus as in claim 10, wherein the means for rotating the sleeve and shaft relative to the housing includes a second drive motor secured to the outershell and means for operatively coupling the motor to the housing.

13. An apparatus as in claim 12, wherein the means for coupling the second drive motor to the housing includes a pulley fixedly secured to the housing and coaxial with the sleeve and shaft and a belt connecting the motor to the fixed pulley.

14. An apparatus as in claim 10, wherein the means for coupling the workpiece transport arm to the shaft includes a first pulley secured to the end of the shaft within the linking arm enclosure, a coupling pin received by the second rotary seal, a second pulley secured to the coupling pin, and a belt connecting the first pulley to the second pulley so that rotation of the shaft relative to the enclosure will cause the work transport arm to rotate.

15. An apparatus as in claim 14, wherein the diameter of the first pulley is about twice the diameter of the second pulley and the length of the linking arm enclosure and the work transport arm are approximately equal, so that rotation of the sleeve while the shaft is not rotated causes the distal end of the workpiece transport arm to translate along a straight line.

16. An apparatus for transporting a workpiece relative to a housing, said apparatus comprising:
   a sleeve mounted to rotate relative to the housing;
   a shaft mounted coaxially within the sleeve;
   a linking arm fixedly attached at one end to the sleeve;
   a workpiece transport arm rotatably secured to the other end of the linking arm;
   a bearing assembly rotatably mounted on the sleeve and fixedly coupled to the shaft;
   a first motor means mounted on the bearing assembly and operatively coupled to the housing;
   a second motor means mounted on the bearing assembly and operatively coupled to the sleeve, whereby the sleeve and shaft may be rotated simultaneously by actuating the first motor means and the sleeve may be rotated independently of the shaft by actuating the second motor means; and
   means for coupling the workpiece transport arm to the shaft so that rotation of the sleeve relative to the shaft causes the workpiece transport arm to rotate relative to the linking arm.

17. An apparatus as in claim 16, wherein the workpiece transport arm is adapted to support a single silicon wafer.

18. An apparatus as in claim 16, wherein the first motor means includes a stepper or DC servo motor coupled to the housing by a belt.

19. An apparatus as in claim 16, wherein the second motor means includes a stepper or DC servo motor coupled to the sleeve by a belt.

20. An apparatus as in claim 16, wherein the means for coupling the workpiece transport arm includes a first pulley fixedly secured to one end of the shaft, a second pulley rotatably mounted at the other end of the linking arm, and means for rotatably coupling the first pulley to the second pulley so that rotation of the linking arm about the shaft causes the second pulley to rotate.

21. An apparatus as in claim 20, wherein the workpiece transport arm is mounted on the second pulley.

* * * * *